United States Patent
Handy et al.

(10) Patent No.: US 9,387,508 B2
(45) Date of Patent: Jul. 12, 2016

(54) METHODS FOR COATING ARTICLES

(71) Applicant: GVD Corporation, Cambridge, MA (US)

(72) Inventors: Erik S. Handy, Malden, MA (US); Aleksander J. White, Arlington, MA (US); W. Shannan O'Shaughnessy, Cambridge, MA (US); Hilton G. Pryce Lewis, Lexington, MA (US); Neeta P. Bansal, Burlington, MA (US); Karen K. Gleason, Cambridge, MA (US)

(73) Assignee: GVD Corporation, Cambridge, MA (US)

( * ) Notice: Subject to any disclaimer, the term of this patent is extended or adjusted under 35 U.S.C. 154(b) by 0 days.

(21) Appl. No.: 14/549,360

(22) Filed: Nov. 20, 2014

(65) Prior Publication Data

US 2015/0079284 A1  Mar. 19, 2015

Related U.S. Application Data (62) Division of application No. 12/979,957, filed on Dec. 28, 2010, now Pat. No. 8,900,663.

(60) Provisional application No. 61/290,440, filed on Dec. 28, 2009.

(51) Int. Cl.

| | | |
|---|---|---|
| *C23C 16/48* | (2006.01) | |
| *C23C 16/50* | (2006.01) | |
| *C08J 7/18* | (2006.01) | |
| *B05D 1/00* | (2006.01) | |
| *B05D 5/08* | (2006.01) | |
| *B05D 7/24* | (2006.01) | |
| *C23C 16/44* | (2006.01) | |
| *B05D 1/34* | (2006.01) | |
| *B05D 3/04* | (2006.01) | |

(52) U.S. Cl.
CPC B05D 1/60 (2013.01); B05D 5/083 (2013.01); B05D 7/24 (2013.01); C23C 16/44 (2013.01); B05D 1/34 (2013.01); B05D 3/0473 (2013.01); B05D 2201/02 (2013.01); B05D 2202/00 (2013.01); Y10T 428/12493 (2015.01); Y10T 428/31649 (2015.04); Y10T 428/31663 (2015.04); Y10T 428/31678 (2015.04)

(58) Field of Classification Search
CPC ............ C08J 7/18; C23C 16/48; C23C 16/50
See application file for complete search history.

(56) References Cited

U.S. PATENT DOCUMENTS

| | | | |
|---|---|---|---|
| 2,453,801 A | 11/1948 | Mattern | |
| 3,322,565 A | 5/1967 | Smith | |
| 4,592,933 A | 6/1986 | Meyerson | |
| 5,888,591 A * | 3/1999 | Gleason | B05D 1/62 257/E21.264 |
| 5,968,377 A * | 10/1999 | Yuasa | H01J 37/32018 118/723 R |
| 7,205,337 B2 * | 4/2007 | Kay | C08G 6/32 424/400 |
| 2004/0005789 A1 | 1/2004 | Jiwari | |
| 2005/0153610 A1* | 7/2005 | McCarthy | C09D 127/12 442/59 |
| 2007/0218344 A1* | 9/2007 | Ji | H01M 8/0245 429/465 |
| 2010/0004373 A1* | 1/2010 | Zhu | C09D 5/00 524/448 |
| 2010/0186740 A1* | 7/2010 | Lewis | A61B 17/00 128/203.15 |

FOREIGN PATENT DOCUMENTS

| | | |
|---|---|---|
| DE | 4092221 | 4/1994 |
| GB | 1034095 | 6/1966 |
| WO | 03038143 | 5/2003 |
| WO | 2010047625 | 4/2010 |

OTHER PUBLICATIONS

Bolognesi, A. et al., "From Block Copolymers to End-Capped Polymers: A Suitable Method to Control the Electro-Optical Properties of Polymeric Materials". Macromolecules 2009, 42, 1107-1113.*

Zhang, Huiqi, et al., "Synthesis and characterisation of hydroxyl end-capped telechelic polymers with poly(methyl methacrylate)—block-poly(n-butyl acrylate) backbones via atom transfer radical polymerisation". Polymer 45 (2004) 1455-1466.*

Lou, Xudong, et al., "Grafting of alkoxyamine end-capped (co)polymers onto multi-walled carbon nanotubes". Polymer 45 (2004) 6097-6102.*

International Search Report PCT/US2010/062242 mailed Jun. 29, 2011.

* cited by examiner

*Primary Examiner* — Bret Chen (74) *Attorney, Agent, or Firm* — Pabst Patent Group LLP (57) ABSTRACT

Methods and systems for coating articles are described herein. The methods and systems described herein include, but are not limited to, steps for actively or passively controlling the temperature during the coating process, steps for providing intimate contact between the substrate and the support holding the substrate in order to maximize energy transfer, and/or steps for preparing gradient coatings. Methods for depositing high molecular weight polymeric coatings, end-capped polymer coatings, coatings covalently bonded to the substrate or one another, metallic coatings, and/or multilayer coatings are also disclosed. Deposition of coatings can be accelerated and/or improved by applying an electrical potential and/or through the use of inert gases.

20 Claims, 9 Drawing Sheets

METHODS FOR COATING ARTICLES

CROSS REFERENCE TO RELATED APPLICATIONS

This application is a divisional of U.S. application Ser. No. 12/979,957, filed Dec. 28, 2010, now U.S. Pat. No. 8,900,633, which claims priority to and benefit of U.S. Provisional Patent Application No. 61/290,440 filed on Dec. 28, 2009. Where permissible, these applications are incorporated herein by reference in their entirety.

FIELD OF THE INVENTION

This invention relates generally to coated articles and methods and systems for forming the coatings.

BACKGROUND OF THE INVENTION

Fluorinated polymer films, such as PTFE (polytetrafluoroethylene) and related polymer coatings may be produced by hot filament chemical vapor deposition (HFCVD), initiated chemical vapor deposition (iCVD), or other vapor phase deposition processes. While these coatings possess many desirable properties, they sometimes do not fulfill all the requirements of certain applications. For example, conventional iCVD PTFE is a fairly soft coating which may not provide adequate levels of mechanical durability for some applications. Further, the adhesion of PTFE to some surfaces requires improvement. Attempts to improve the mechanical properties and adhesion of iCVD PTFE by varying process conditions, film chemistry, and surface treatment techniques has proved challenging due to the non-polarity and chemical inertness of PTFE's polymeric backbone. Accordingly, new methods for forming coatings with improved mechanical properties are needed.

While PTFE is a fairly lubricious coating, PTFE polymeric chains produced by iCVD may have polar end groups, reducing the coating's lubricity and overall stability. High lubricity is useful for applications where one coated surface needs to slide over another while the two are in physical contact (e.g., a stopper sliding over the surface of a syringe barrel). Accordingly, methods of eliminating polar end groups on PTFE chains and improving the lubricity of PTFE coatings would be useful.

During iCVD or HFCVD of coatings, heated filaments used to decompose process gases can also degrade temperature sensitive articles (e.g., polymeric medical articles). Examples of such articles include elastomeric seals, which may subsequently be incorporated into medical devices or semiconductor processing equipment or aerospace platforms. The coatings may be polymeric or non-polymeric. To accommodate these temperature sensitive articles, methods for cooling the article during coating deposition would be useful.

For other applications, it may be desirable to raise the temperature of an article during coating deposition. At low temperatures, articles may be coated with an undesirable proportion of low-molecular-weight polymeric chains using iCVD, adversely impact the articles' performance in some applications. Raising the temperature of the articles during coating discourages the adsorption of these low-molecular-weight chains.

Typically, conventional CVD equipment employs flat sample stages whose geometry may not be complementary to that of the articles being coated. Many polymeric articles, for example, exhibit low thermal conductivities and have complex shapes. Therefore, even if these conventional stages were heated or cooled, the temperature of polymeric articles with complex shapes may not be adequately controlled. As a result, the articles may still either be thermally degraded by the heated filaments or be coated with a coating that exhibits undesirable performance. Accordingly, new methods for the temperature control of substrates are required.

Thermal damage to low-temperature articles can be exacerbated by in-service deformation of the heated filaments. Deformation may be initially caused by filament stretching and later by out-of-plane filament bowing when the filament is heated to coating deposition temperatures. The filament may bow toward the parts being coated. In addition to damaging the articles themselves, increased proximity of the hot filament to the articles may discourage adsorption and growth of the polymer coating being deposited. As such, the coating deposition rates may drop to levels that are intolerable in a high-volume manufacturing environment. Means of detecting and preventing filament deformation are required so as to minimize any negative impact of such deformation on the coating deposition process. The filament replacement schedule that is typical of hot-filament CVD processes (e.g., due to filament aging, deformation, or breakage) may also require prohibitively-long production delays. Means of shortening these delays would be useful.

SUMMARY OF THE INVENTION

Coated articles and methods and systems for coating the articles are described herein. The methods and systems described herein include, but are not limited to, steps for actively or passively controlling the temperature during the coating process, steps for providing intimate contact between the substrate and the support holding the substrate in order to maximize energy transfer, and/or steps for preparing gradient coatings. Methods for depositing high molecular weight polymeric coatings, end-capped polymer coatings, coatings covalently bonded to the substrate or one another, metallic coatings, and/or multilayer coatings are also disclosed. Deposition of coatings can be accelerated and/or improved by applying an electrical potential and/or the use of inert gases.

The temperature of the articles can be controlled in a variety of ways. In some embodiments, the temperature of an article is regulated by intimate contact of the articles with a temperature-controlled support. In other embodiments, the temperature of an article is regulated by gas flow.

Figure 2:
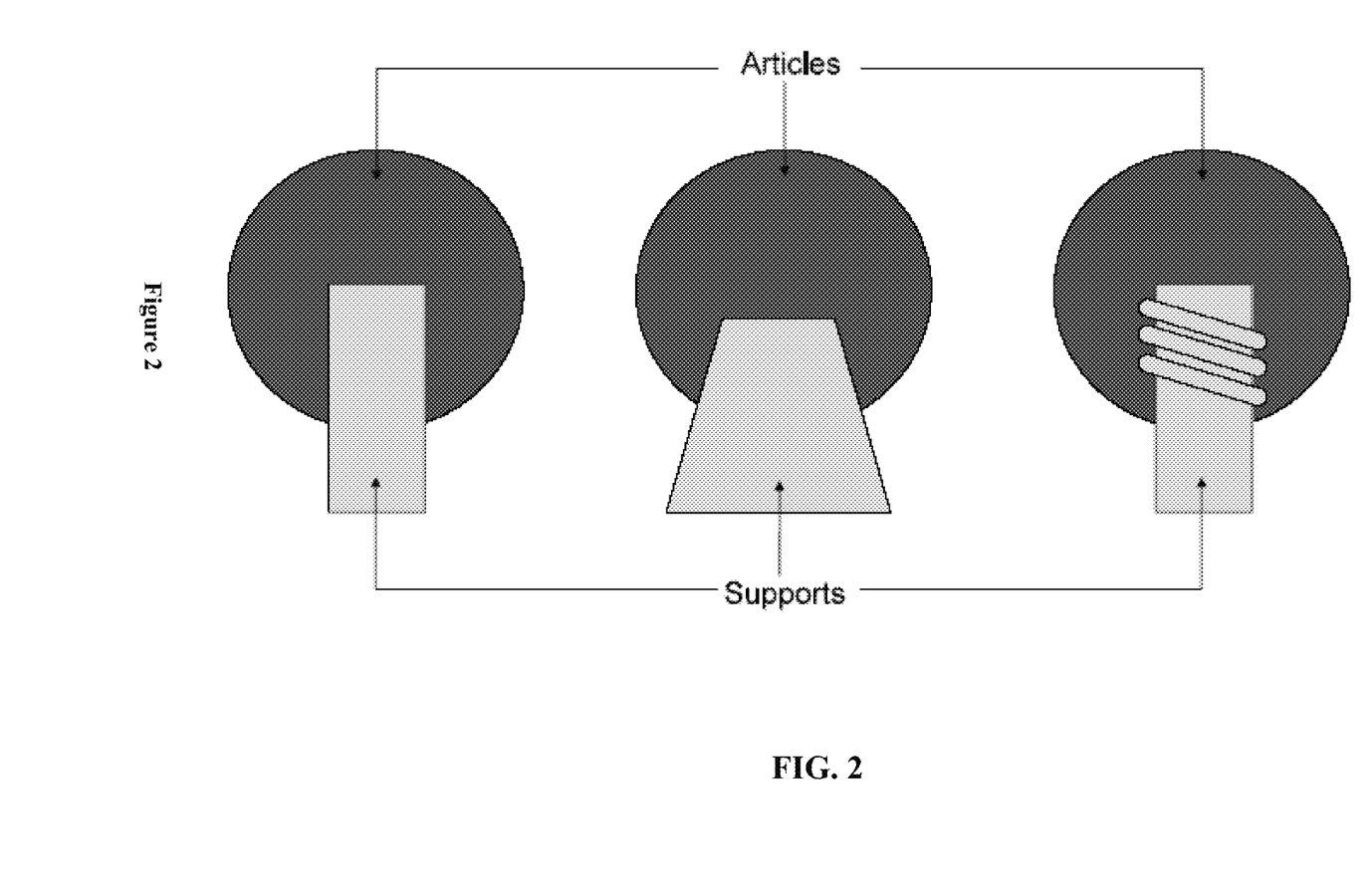
FIG. 2 shows examples of articles to be coated and supports for the articles wherein the articles and the supports have complementary shapes in order to ensure intimate contact between the supports and the articles.

Intimate contact of the article with the support can be achieved using a variety of techniques. For example, in one embodiment, articles with complex shapes may rest on the supports so as to ensure adequate backside cooling of the articles during polymer coating. The supports are attached to the temperature-controlled plate. In some embodiments, the supports have a shape (e.g., male) that is complementary to the shape (e.g., female) of the articles being coated, such as square, triangular, rhomboid, circular, ovoid, rectangular, diamond, or pointed needle (FIG. 2). In other embodiments, the support is fitted with a means of retaining and positioning the article in intimate contact with the support, such as a set of screw threads that match those of the article it will support. Screwing the article onto the support, for example, ensures intimate contact between the article and the support, and accordingly efficient transport of heat from the article to the support and thus to the temperature-controlled plate.

Improved filament systems, particularly for HFCVD, are also described. In one system, the hot filament coating system includes a sensor to indicate filament deformation. In another system, the system includes a pyrometer to measures the temperature of the filaments and indicate mechanical deformation. Another HFCVD system is disclosed wherein the filament array is configured perpendicular to the plane of the sample stage. In another HFCVD system, a filament array composed of individually spring-loaded filaments is described. In another system, a "reel-to-reel" filament array is disclosed. In this system, filaments are fed into a coating deposition zone from one or more reels and removed from the coating deposition zone by one or more reels.

Using the methods described herein, PTFE layers composed of PTFE polymeric chains having a high percentage of $CF_2$ repeat units (high chemical purity) can be formed. In some cases, as least 70% of the repeat units are $CF_2$; at least 80% of the repeat units are $CF_2$; in some cases, at least 90% of the repeat units are $CF_2$; in some cases, at least 95% of the repeat units are $CF_2$; and in some cases, at least 99% of the repeat units are $CF_2$, or even about 100%. This is notable in that typical plasma-enhanced chemical vapor deposition (PECVD) techniques often do not produce PTFE coatings with such high chemical purity, with about 40-60% retention of $CF_2$ groups being more typical. Conventional PECVD PTFE coatings are often characterized by dangling bonds, double bonds, and crosslinks. The percentage of $CF_2$ units within the PTFE layer may be determined using fluorine-19 magic angle spinning nuclear magnetic resonance ($^{19}F$-NMR) or high-resolution X-ray photoelectron spectroscopy (XPS).

DETAILED DESCRIPTION OF THE INVENTION

I. Definitions

"Activated", as used herein, refers to chemical species acted upon by an energy source so as to render the species capable of forming a coating on the deposition substrate. Activated species include, but are not limited to, ions, and free radicals, such as di-radicals, and combinations thereof.

"Article", as used herein, refers to objects whose surface is coated using a vapor-phase coating system. Suitable articles include, but not limited to, medical devices, electronic components, optical components, industrial molding & stenciling components, elastomeric seals & gaskets, personal grooming products, microelectronic mechanical (MEMS) devices, microfluidic devices, aviation components, assembled electronic devices, The surface of the article is also referred to herein as the substrate. The article may be formed of metal, glass, ceramic, plastic, textile, or combinations thereof.

"End-capped polymer coating", as used herein, refers to a polymer coating containing polymer chains originating and/or terminated in, or with, a specific chemical moiety. The polymer chains may be linear or branched.

"Energy Source", as used herein, refers to the method of energy input into a gaseous system capable of activating precursor gas species so as to render them capable of forming a coating on the deposition substrate. Example energy sources include, but are not limited to, heated filaments, ionic plasma excitation, gamma irradiation, ultraviolet irradiation, infrared irradiation, and electron beam excitation.

"Filament", as used herein, refers to resistively heated lengths of material capable of one or more of the following: thermal excitation of precursor gases, evaporative transfer of metal to the deposition substrate, or convective or radiative heating of the substrate.

"Gradient polymer coating", as used herein, refers to deposited coating(s) in which one or more physical, chemical, or mechanical properties vary over the deposition thickness. Variation may be continuous or step-wise without limit to the number of steps or changes in different properties.

"Inert Gas", as used herein, refers to a gas or gases which are not reactive under reaction conditions within the vacuum chamber.

"Intimate Contact", as used herein, refers to the placing of two surfaces directly adjacent to one another so as to maximize heat transfer between the two. An application of force may serve to maximize intimate contact through depression of microscopic surface asperities and an increase in real surface area of contact.

"Mechanically interlock", as used herein, refers to methods of bringing a substrate into intimate contact with a substrate holder, such as a temperature controlled substrate holder, so as to maximize contact surface area and minimize resistance to heat transfer between the substrate and the holder.

"Support", as used herein, refers to means of retaining and positioning an article within the vacuum chamber during coating. The supports can be attached to a temperature-controlled plate. In some embodiments, the supports have a shape (e.g., male) that is complementary to the shape (e.g., female) of the articles being coated, such as square, triangular, rhomboid, circular, ovoid, rectangular, diamond, or pointed needle. In other embodiments, the support is fitted with a means of retaining and positioning the article in intimate contact with the support, such as a set of screw threads that match those of the article it will support. The temperature of the supports can optionally be actively or passively controlled so as to regulate the temperature of the articles during coating.

"Vapor-phase coating system", as used herein, refers to any system utilized to deposit a dry coating on a substrate without need for subsequent solvent evaporation or thermal curing. Examples include, but are not limited to, chemical vapor deposition (including atmospheric CVD), atomic layer deposition, and physical vapor deposition.

"Water contact angle", as used herein, refers to the angle of incidence of a water droplet in air on the surface of a material. In one embodiment, the water contact angle is measured by a goniometer using the sessile drop technique. Drop volume should be between 5 µL and 50 µL and should be increased incrementally by between 1 µL and 5 µL between measurements until a consistent value is achieved. In another embodiment, the "receding water contact angle" is measured as the volume of a water droplet on a surface decreases with time Drop volume should be between 25 µL and 50 µL before commencing measurement and should be decreased incrementally by 1-3 µL between measurements until a consistent value is achieved.

II. Methods for Coating Articles Using Vapor Deposition Processes

Methods for forming coatings on articles and systems and processes for producing such coatings are described herein. The coatings may be polymeric or non-polymeric. The coatings can be formed using a variety of different monomeric species, such as difluorocarbene, ethylenedioxythiophene, trivinyltrimethylcyclotrisiloxane, hydroxyethylmethacrylate, vinylpyrrolidone, functional acrylates, functional methacrylates, diacrylates, dimethacrylates, and siloxane compounds containing unsaturated organic moieties. Other suitable coating materials include graphene, graphite, molybdenum disulfide, tungsten disulfide, electrically conductive coatings, electrically insulating coatings, and hydrophilic coatings. In some embodiments, the hydrophilic coatings may be PHEMA (poly-2-hydroxyethylmethacrylate) and/or PVP (polyvinylpyrrolidone). In another embodiment, the electrically conducting coating may be polyethylenedioxythiophene (PEDOT). In another embodiment, the electrically insulating coating may contain siloxane moieties, such as in polytrivinyltrimethylcyclotrisiloxane. In one embodiment, the monomer is difluorocarbene which forms polytetrafluoroethylene (PTFE) upon polymerization. In a further embodiment the diflourocarbene monomeric units are formed from degradation of hexaflouropropyleneoxide.

The methods and systems described herein include steps for actively or passively controlling the temperature during the coating process, steps for providing intimate contact between the substrate and the support holding the substrate in order to maximize energy transfer, and/or steps for preparing gradient coatings.

A. Temperature Control of an Article During Coating

For certain applications, it is desirable to cool the surface of an article during coating. During processes such as HFCVD, iCVD, PECVD, and atmospheric plasma vapor deposition, energy input to the gas phase reagents might otherwise elevate the temperature of the articles being coated. As a result, traditional vapor phase coating methods may not be compatible with temperature-sensitive articles (e.g., medical articles, polymeric articles, etc.). Cooling an article ensures that the temperature sensitive article is not thermally damaged during the coating process.

Cooling the surface of an article can also be used to encourage coating growth. In vapor deposition processes, the gas-phase monomers responsible for coating formation have a finite sticking coefficient with regard to their adsorption on the articles. If the heated filaments, or other means of energy input, raise the temperature of the articles, the monomers may be encouraged to desorb from the article surface rather than polymerizing and forming the desired coating.

For example, during the formation of PTFE coatings, adhesion of difluorocarbene ($:CF_2$) species and of growing PTFE oligomers [i.e., $(CF_2)_x$] to the articles are desirable to support coating growth. In general, the lower the article temperature, the more readily reactive species adhere to the article. As a result, lowering the article temperature will result in an increased deposition rate of the coating. In some embodiments, the temperature of the articles may be lowered by at least 5° C., 10° C., 15° C., 20° C., 25° C., 30° C., 35° C., 40° C., 45° C., 50° C., 55° C., 60° C., 65° C., 70° C., 75° C., 80° C., 90° C., OR 100° C. or more, during deposition of the coating.

For other applications, it may be desirable to raise the temperature of the surface of an article during coating deposition. In the case of PTFE coatings formed using HFCVD or iCVD, polymeric chains having a range of molecular weights may be deposited. The molecular weight of the PTFE chains in the PTFE layer may range from about 138 g/mol to about 50,000 g/mol.

In some applications, the presence of low-molecular-weight PTFE chains in the coating is undesirable. For example, if a coating having significant mechanical durability is desired, the performance of a PTFE coating is improved if the molecular weight distribution of constituent PTFE chains can be shifted to higher average molecular weights.

As discussed above, difluorocarbene and low-molecular-weight PTFE species (i.e. oligomers) exhibit smaller sticking coefficients than high molecular weight species. (The sticking coefficient of difluorocarbene is typically on the order of $10^{-4}$-$10^{-3}$ in the absence of low energy ion bombardment.) By elevating the temperature of the article being coated, adsorption of low molecular weight species is discouraged in favor of adsorption of higher molecular weight PTFE chains with greater sticking coefficients.

In addition, smaller polymeric chains which do remain adsorbed to the article surface at elevated temperatures have greater mobility at these higher temperatures. Accordingly, these chains may have enough thermal energy to sample a number of adsorption sites on the article. As such, the reactive ends (termini) of one polymer chain may be afforded more opportunity to find the reactive ends of other polymer chains and conjugate with them, increasing the overall molecular weight of the polymer chains. This has the effect of shifting the overall molecular weight distribution of the PTFE chains in the coating to higher average molecular weights.

Similarly, if low-volatility monomers are being used to form the coating, keeping the article temperature high discourages monomer condensation on the articles in instances where condensation is undesirable.

In some embodiments, the temperature of the articles may be raised to at least 30° C., 50° C., 60° C., 75° C., 100° C., 125° C., 150° C., 175° C., 200° C., 250° C., or 300° C., or more, during deposition of the coating. The temperature may be raised to a temperature of less than 500° C. It should be understood that some methods may involve raising the temperature of the articles to temperatures outside these ranges during deposition of the coating. In some cases, the methods do not involve raising the temperature of the article during deposition of the coating.

One of ordinary skill in the art will recognize that the methodologies of substrate temperature control disclosed below can be applied to any method of coating,

B. Intimate Contact Between Articles and Supports

Figure 1:
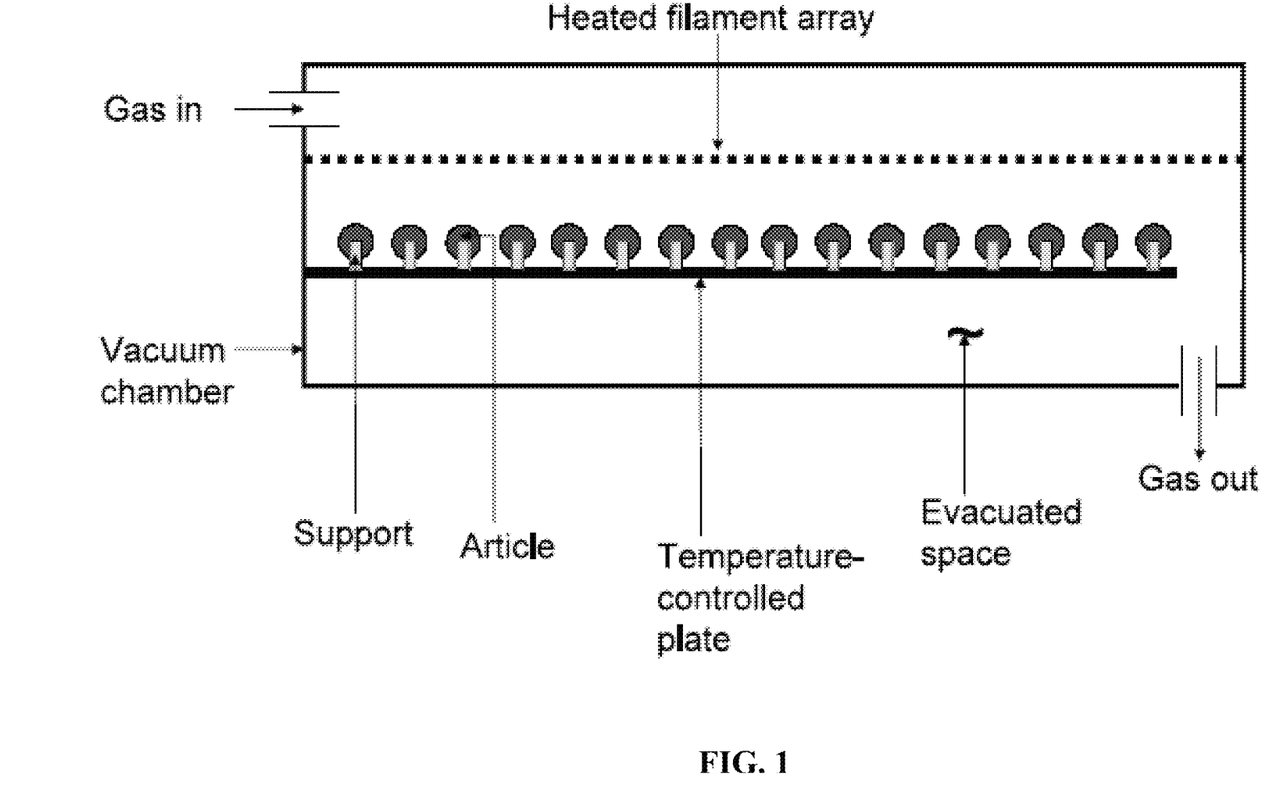
FIG. 1 shows a side view of a coating system wherein the surface temperature of articles is regulated through intimate contact between the articles and supports.

FIG. 1 shows a side view of a coating system wherein the surface temperature of articles is regulated through intimate contact between the articles and supports. The coating system includes a vacuum chamber, an inlet port through which a reactive gas may be fed into the chamber, an array of heated filaments which cross the coating deposition zone (where the articles are located), and a gas outlet port. The filaments are shown in side view as well, i.e., looking down the long axes of the filaments, which run parallel to the plane of the temperature-controlled plate.

In one embodiment, the substrate is mechanically interlocked with the support. The substrate can be mechanically interlocked with the supports using a variety of methods. For example, in one embodiment, articles with complex shapes may rest on the supports so as to ensure adequate backside cooling of the articles during polymer coating. The supports are attached to the temperature-controlled plate. In some embodiments, the supports have a shape (e.g., male) that is complementary to the shape (e.g., female) of the articles being coated, such as square, triangular, rhomboid, circular, ovoid, rectangular, diamond, or pointed needle (FIG. 2). In other embodiments, the support is fitted with a means of retaining and positioning the article in intimate contact with the support, such as a set of screw threads that match those of the article it will support. Screwing the article onto the support, for example, ensures intimate contact between the article and the support, and accordingly efficient transport of heat from the article to the support and thus to the temperature-controlled plate.

In one embodiment, the substrate is mechanically interlocked with the support when 20%, 25%, 30%, 35%, 40%, 45%, 50%, 55%, 60%, 65%, 70%, 75%, 80%, 85%, 90%, or 95% of the substrate surface not to be coated is in direct contact with the support. In a preferred embodiment, the percent of the substrate surface not to be coated that is in direct contact with the support is 50%, preferably 75%, more preferably 90%. In another embodiment, mechanical interlock is achieved, for purposes of temperature control, when the substrate temperature deviates no more than 50%, 45%, 40%, 35%, 30%, 25%, 20%, 15%, 10%, 9%, 8%, 7%, 6%, 5%, 4%, 3%, 2%, or 1% from the temperature of the substrate support. In particular embodiments, the substrate temperature deviates no more than 25%, preferably no more than 10%, more preferably no more than 5% from the temperature of the substrate support.

The temperature of the support can be passively controlled. For example, the support can be constructed of a high-thermal-conductivity material such as a metal. In this case, the difference between the temperature of the support and that of the temperature-controlled plate is expected to be small.

The temperature-controlled plate can be cooled by, for example, circulating a low-temperature or cryogenic fluid through channels integrated with the stage. In such an arrangement, fluid temperature can be maintained using a chiller. The plate can also be cooled via thermoelectric cooling. Similarly, the temperature-controlled plate can be heated, for example, via the circulation of a heated fluid through the plate, or via resistive heating. In such cases, the temperature of the supports is regulated by virtue of the supports being in contact with the temperature-controlled plate.

Alternatively, the temperature of the supports can be actively controlled. The temperature of the supports can be lowered, such as by flowing refrigerated fluid through the supports or by thermoelectric cooling the supports. The temperature of the supports can also be raised by flow of heated fluid through the supports or by resistive heating of the supports, for example. The temperature of the supports can be actively regulated independently from or in conjunction with the regulation of the temperature-controlled plate.

1. Flow of Temperature-Controlled Gas

Figure 3:
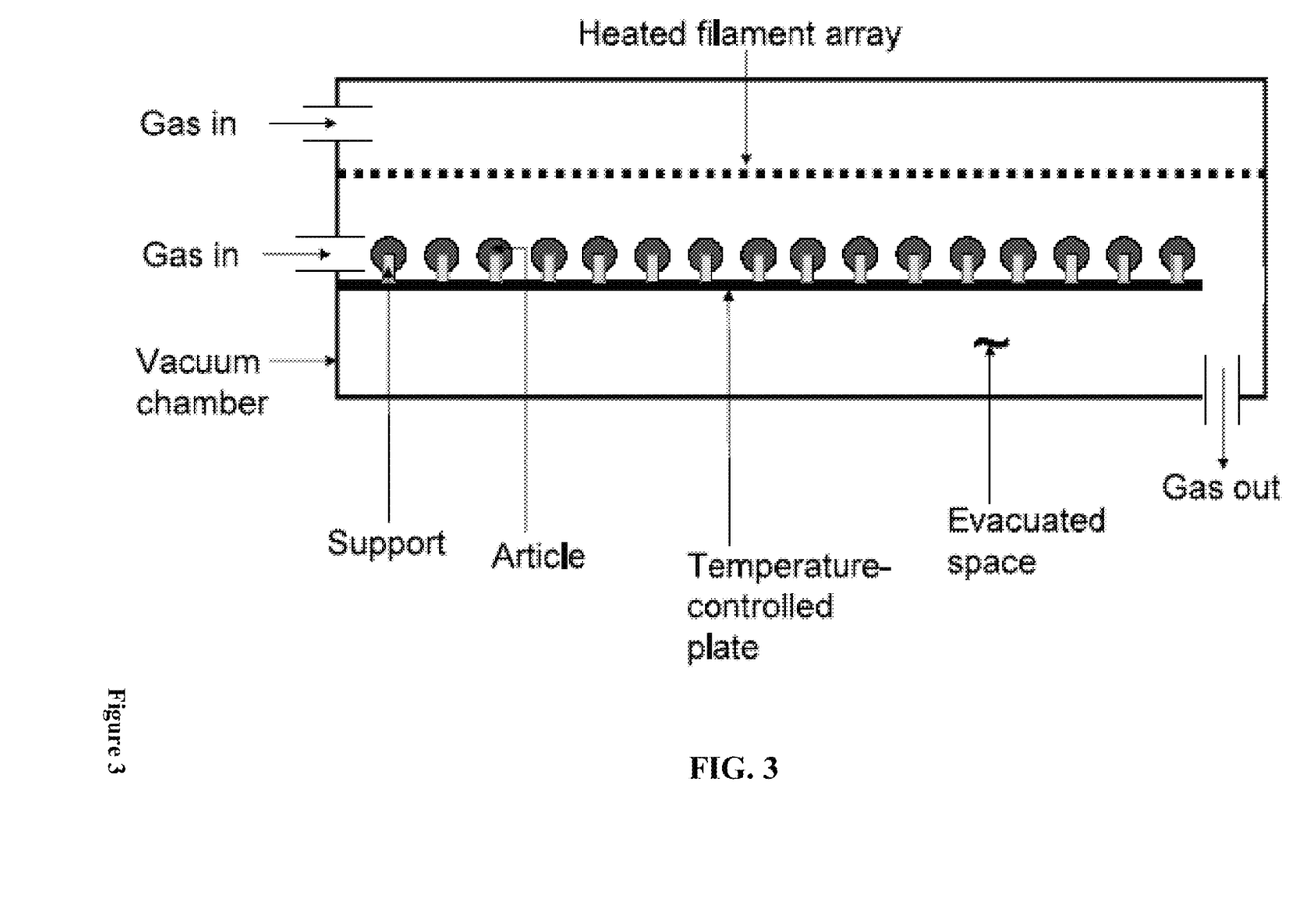
FIG. 3 shows a side view of a coating system wherein the surface temperature of the articles is regulated by the flow of a temperature controlled gas.

FIG. 3 shows a side view of a coating system wherein the surface temperature of articles is regulated by the flow of a temperature controlled gas. A gas may be input into the chamber so as to regulate the surface temperature of the articles during the coating process. The gas may be directed so as to contact the articles before contacting the heated filaments or encountering any other source of energy input to the reactor. Directing the gas in this manner may be useful for keeping the gas and the articles cool. The gas may be inert. The gas may be heated, for example by using a gas heater, or cooled, for example by using a cold finger.

If a gas is being used to control the temperature of the articles, the articles may not need to rest on supports. Because coating formation is based on gas-phase deposition, the gas used to regulate the temperature of the articles may interfere with coating formation. For this reason, it may be desirable for the gas flow to be kept at a low rate or to be intermittent or both, keeping the articles at the desired temperature but also facilitating coating formation. The temperature of individual articles may also be controlled by controlling the temperature of heated filaments. Other heated chamber components (e.g., a sublimation crucible) may be used as heat sources in addition to or instead of heated filaments.

C. Forming High Molecular Weight Polymer Coatings

In the case of polymeric coatings deposited on a surface using HFCVD or iCVD, the coating will typically contain polymeric chains having a range of molecular weights. For example, PTFE layers deposited using standard HFCVD or iCVD conditions will typically contain PTFE chains ranging from about 138 g/mol to about 50,000 g/mol. For many applications, it is desirable to obtain coatings with higher average molecular weight polymeric chains.

A method of forming a polymer coating with increased average molecular weight polymeric chains on an article is disclosed, including the steps of (1) evacuating a vacuum chamber, (2) raising the temperature of the article, (3) introducing one or more gases into the vacuum chamber, (4) directing the one or more gases into the vicinity of an energy source, thereby activating the one or more gases, and (5) forming a polymer coating on the article.

A variety of energy sources may be used to activate one or more of the process gases, including, but not limited to, one or more heated filaments, ionic plasma, pulsed plasma, UV irradiation, or gamma irradiation. The coating may be PTFE.

The article temperature may be raised (e.g., to about 30° C. or more) to increase the average molecular weight of the polymeric chains in the coating. The surface temperature of the article can be controlled by a variety of methods as discussed above. The temperature of the article may be raised by resistively-heating the article (such as a metallic razor blade). The temperature of the article may be raised using the heated filaments. The method can further include resting the article on a support and/or a temperature-controlled stage prior to coating. Pursuant to this method, the temperature of the article may be raised by raising the temperature of the support and/or the temperature-controlled stage which is heated by, for example, circulation of a heated fluid or resistive heating the support and/or stage. The article can also be heated by flow of a gas. The gas may be heated. Gas flow may be directed to contact the article before contacting the filaments or other energy source. In some embodiments, the gas flow may be intermittent. In other embodiments, the gas may be inert.

D. Methods for Forming End-Capped Polymer Coatings

For some applications, it may be desirable to form polymer coatings exhibiting improved lubricity. Conventional HFCVD methods of forming polymer coatings do not include a polymer chain termination step. As a result, reactive groups are retained at the end of each polymer chain. On exposure to the atmosphere, such groups can react with ambient oxygen and/or moisture, forming polar end groups (e.g., carboxylic acids, sulfonic acids, hydroxyl groups, amines, etc.) on the polymer chains, reducing the lubricity of the coating. Polar end groups may also increase the surface energy of the coating and compromise other desirable properties such as hydrophobicity.

To prevent the formation of polar end groups, a method of forming an end-capped polymer coating on an article is disclosed including the steps of (1) evacuating a vacuum chamber, (2) introducing a precursor gas and a fluorocarbon gas into the vacuum chamber, (4) directing the precursor gas and the fluorocarbon gas into the vicinity of one or more heated filaments, thereby activating the one or more gases, and (5) forming an end-capped polymer coating on the article.

In a related embodiment, to prevent the formation of polar end groups, a method of forming an end-capped polymer coating on an article is disclosed including the steps of (1) evacuating a vacuum chamber, (2) introducing a precursor gas into the vacuum chamber, at or below atmospheric pressure (3) directing the precursor gas into the vicinity of an energy source, thereby activating the precursor gas, (4) forming a polymer coating on the article, (5) ceasing flow of the precursor gas and commencing flow of a fluorocarbon gas and, (6) directing the fluorocarbon gas into the vicinity of an energy source, thereby activating the fluorocarbon gas, and (7) terminating the polymer chains of the coating with activated fragments of the fluorocarbon gas.

The sequential method described above permits the use of a variety of energy sources to activate the gases, including, but not limited to, one or more heated filaments, ionic plasma, pulsed plasma, UV irradiation, or gamma irradiation.

The backbone of the polymer chains in the polymer coating is formed from the precursor gas. The precursor gas may be, for example, hexafluoropropylene oxide (HFPO). The polymer chains thus formed may be terminated ("end-capped") by a fluorocarbon gas. The fluorocarbon gas may be, for example, hexafluoroethane. In this case, homolysis of hexafluoroethane produces trifluoromethyl radicals, which react with the reactive ends of the PTFE chains formed from HFPO, yielding PTFE terminated by non-polar trifluoromethyl groups.

The degree of end-capping can be controlled by varying the amount of gas introduced into the chamber. In one embodiment, the percent of end groups that are end-capped is at least 5%, 10%, 15%, 20%, 25%, 30%, 35%, 40%, 45%, 50%, 55%, 60%, 65%, 70%, 75%, 80%, 85%, 90%, or 95%. In a particular embodiment, the percent of end groups that are end-capped is greater than 40% preferably greater than 50%, more preferably greater than 70%.

The end-capped chains may afford coated articles with improved lubricity. Ordinarily, the PTFE polymer may readily crystallize due, in part, to its stereoregularity and low steric bulk. Lubricity of PTFE coatings may be improved by end-functionalizing the PTFE chains with sterically-bulky termini (i.e., end groups whose diameter may be large enough to prevent efficient PTFE crystallization. Consequently, PTFE chains terminated with bulky end groups may slide over one another more readily, affording greater coating lubricity.

Articles produced by these methods are disclosed, having an outer surface coated with a PTFE layer having a thickness of between about 1 nm and about 25 microns, wherein at least a portion of the PTFE layer comprises polymeric chains formed of repeat units with at least 70% of the repeat units being $CF_2$ and with end groups having diameters greater than that of the polymeric chains. In one embodiment, the use of fluorocarbon end groups may reduce the receding contact angle with water by 3%, 5%, 10%, 15%, 20%, 25%, or 30%, as determined by goniometry. In a particular embodiment, the use of fluorocarbon end groups may reduce the receding contact angle with water by 5°, more preferably by 10° most preferably by 15°. In one embodiment, sterically-bulky end groups may decrease crystalline content of the PTFE film by 3%, 5%, 10%, 15%, 20%, 25%, 30%, or 35%. In a particular embodiment, sterically-bulky end groups may decrease crystalline content of the PTFE film by 5%, more preferably 10%, most preferably 25% as measured by dynamic scanning calorimetry. Crystalline content is calculated by the ratio of the latent heat of melting of the sample to the product of the specific heat of melting of the material and the sample mass.

E. Methods for Forming Multilayer Coatings

In another embodiment, a multilayer coating composed of at least two different materials is formed. A method of coating an article with multiple layers is disclosed including the steps of (1) evacuating a vacuum chamber, (2) introducing one or more gases into the vacuum chamber, (3) directing the one or more gases into the vicinity of an energy source, thereby activating the one or more gases, (4) forming a polymer coating on the article, (5) depositing one or more alternate coatings, and (6) repeating steps (1)-(4) to form a polymer.

A variety of energy sources may be used to activate one or more of the gases, including, but not limited to, one or more heated filaments, ionic plasma, pulsed plasma, UV irradiation, or gamma irradiation.

The polymer coating may be, for example, PTFE. A variety of alternate coatings can be deposited, including, but not limited to, graphene, graphite, molybdenum disulfide, tungsten disulfide, electrically conductive coatings, electrically insulating coatings, and hydrophilic coatings. In some embodiments, the hydrophilic coatings may be PHEMA (poly-2-hydroxyethylmethacrylate) and/or PVP (polyvinylpyrrolidone). In another embodiment, the electrically conducting coating may be polyethylenedioxythiophene (PEDOT). In another embodiment, the electrically insulating coating may contain siloxane moieties such as in polytrivinyltrimethylcyclotrisiloxane.

Articles produced by this method are disclosed. In one embodiment, an article is disclosed having a surface coated with at least one PTFE layer having a thickness of between about 1 nm and about 25 microns, wherein at least a portion of the PTFE layer contains polymeric chains formed of repeat units with at least 70% of the repeat units being $CF_2$, and at least one layer comprised of an alternate coating. The alternate coating may be, for example, graphite, graphene, molybdenum disulfide, tungsten disulfide, an electrically conductive coating, an electrically insulating coating, or a hydrophilic coating. In one embodiment, the hydrophilic coatings may be PHEMA and/or PVP. In another embodiment the electrically conductive coating may be polyethylenedioxythiophene (PEDOT). In another embodiment, the electrically insulating coating may contain siloxane moieties such as in polytrivinyltrimethylcyclotrisiloxane.

F. Methods for Forming Gradient Polymer Coatings

For some applications, it is advantageous to form gradient coatings in which one or more physical, chemical, or mechanical properties vary over the coating thickness. The variation may be continuous or step-wise without limit to the number of steps or changes in different properties. A method for forming a gradient polymer coating is disclosed, including the steps of (1) evacuating a vacuum chamber, (2) introducing one or more gases into the vacuum chamber, (3) directing the one or more gases into the vicinity of an energy source, thereby activating the one or more gases, forming a polymer coating on the article, and (4) varying one or more process conditions during deposition to form a gradient coating.

A variety of energy sources may be used to activate one or more of the gases, including, but not limited to, one or more heated filaments, ionic plasma, pulsed plasma, UV irradiation, or gamma irradiation.

A variety of process conditions can be varied to form the gradient coating. For example, if the energy source is a heated filament array, the temperature of the heated filament array can varied during the process. If the energy source is ionic plasma, the energy input to the plasma can be varied during the process. If the energy source is pulsed plasma, the duty cycle can varied during the process.

Gas flowrates, article temperature, and/or chamber pressure can also be varied as means for preparing gradient films. The relevant range of gas flowrates is dependent upon the chamber volume. In one embodiment, the flowrate(s) are from 0.05 sccm/$10^3$ cm$^3$ to 50 sccm/$10^3$ cm$^3$. In other embodiments, the relevant temperature range may be, for example, between −50° C. and 350° C. In still other embodiments, the relevant pressure range may be, for example, between 10 mTorr and atmospheric pressure.

Other process conditions can be varied including, but not limited to, the molar or volume ratio of gases introduced into the chamber, and the proximity of the article to the energy source. The variation of process conditions to alter the properties of the coating over time can be stepwise or gradual, without limit to the number of steps or changes in different properties.

G. Methods for Vapor Phase Deposition of a Coating Using an Applied Electrical Potential As discussed above, reducing the temperature of the articles being coated may be important for accelerating the rate at which the coating deposits. Another method of accelerating coating deposition involved applying an electrical potential. In one embodiment, an article or articles is coated by (1) evacuating a vacuum chamber, (2) applying an electrical potential between a chamber component and a stage on which the article rests, (3) introducing one or more gases through a gas inlet port into the vacuum chamber, (4) directing the one or more gases into the vicinity of an energy source, thereby activating the one or more gases, (5) accelerating the one or more gases and activated species therefrom toward the article, and (6) forming a coating on the article.

A variety of energy sources may be used to activate one or more of the gases, including, but not limited to, one or more heated filaments, ionic plasma, pulsed plasma, UV irradiation, or gamma irradiation. The polymer coating may be, for example, PTFE.

The electric potential can be applied between a variety of chamber components and a stage on which the article rests. For example, the chamber component may be positioned between the gas inlet port and the stage. In one embodiment, the chamber component is the gas inlet port. In another embodiment, the energy source is a heated filament array, and the chamber component is the filament array or portion thereof.

H. Methods for Vapor Phase Deposition of a Coating Using an Inert Gas

Gases which are not reactive under the chamber conditions can impact coating properties in other ways. Accordingly, it may be desirable to dilute the reactive gases used to form the coating with an inert gas.

For example, during the deposition of PTFE, PTFE polymeric chains may form on the surface of articles and/or in the gas phase. PTFE which polymerizes in the gas phase may be more likely to deposit on the articles as nano- or microscale particles. Inclusion of such particles in the coating may not be desirable for certain applications, particularly those in which low surface roughness and/or high coating adhesion are required. If the coating includes such particles, the interfacial area between the coating and the underlying article may be reduced, resulting in reduced coating adhesion.

Even a well-adhered coating exhibiting high surface roughness may not perform optimally in some instances. For example, PTFE coatings may be used as mold release agents. In such cases, a tacky, uncured (semi)solid (e.g., an uncured tire or epoxy resin) may be pressed into contact with the rough PTFE coating. As a consequence, the interfacial area between the soft, tacky material and the rough coating may be undesirably large. Upon curing the material, disengaging the cured material from the coated mold may result in a cohesive and/or adhesive failure of the coating, wherein some of the PTFE coating is removed from the mold.

For such applications, a smooth PTFE coating may be preferable. To form such coatings, it may be desirable to discourage gas-phase PTFE polymerization by diluting the reactive gas (e.g., hexafluoropropylene oxide, HFPO) and any reactive products (e.g., difluorocarbene) with an inert gas, such as nitrogen. Dilution may encourage polymerization of PTFE on the surface of the articles themselves and discourage gas-phase polymerization, resulting in less inclusion of PTFE particles in the coating.

Another method of coating deposition is disclosed, including the steps of (1) evacuating a vacuum chamber, (2) introducing a precursor gas and an inert gas into the vacuum chamber, (3) directing the one or more gases into the vicinity of an energy source, thereby activating the precursor gas, and (4) forming a coating on the article.

A variety of energy sources may be used to activate the precursor gas, including, but not limited to, one or more heated filaments, ionic plasma, pulsed plasma, UV irradiation, or gamma irradiation. The precursor gas may be, for example, HFPO. The inert gas may be, for example, nitrogen. In some cases, the article may be heated or cooled during deposition.

In one embodiment, the method may further comprise the step of exposing the article to other reagents after forming the coating. Other reagents may include, but are not limited to, ionizing radiation, oxygen, water vapor, diamines, carbodiimides, peroxides, and alkyl halides. Examples of ionizing radiation include gamma radiation and electron beam radiation. In this method, bonds may be created between the coating and the article. The bonds may be covalent bonds, hydrogen bonds, or ionic bonds. The peroxides may be, for example, hydrogen peroxide or alkyl peroxides such as di-tert-butyl peroxide. The alkyl halides may be, for example, n-butyl halide, isobutyl halide, sec-butyl halide, and tert-butyl halide.

In another embodiment, the article may be exposed to other reagents, as detailed above, prior to coating formation. These reagents may improve coating adhesion by creating active sites on the substrate to which reactive gaseous species may covalently attach or strongly bind non-covalently during coating deposition. The reactive gaseous species could be, for example, a $CF_2$ diradical produced through pyrolysis of HFPO. In a further embodiment, the exposure of the article to one or more reagents occurs in situ within the deposition chamber to avoid deactivation of the substrate surface prior to coating.

In another embodiment, a first coating layer is applied to the substrate through vapor deposition or other means. Examples of this first layer include an acrylate polymer possessing reactive moieties, such as amines, or a monolayer or multilayer of silane molecules possessing reactive moieties (a so-called "silane polymer"). This first layer may then additionally be exposed to other reagents (as detailed above) to provide further improvement in coating adhesion. The first layer may then serve to improve coating adhesion by facilitating covalent attachment or strong association with reactive gaseous species or with subsequently-deposited polymer coatings.

Gas flow over the articles may also be used as a soft shutter (or "gas curtain") to prevent deposition of a coating on the articles until such time as deposition is desired. For example, in HFCVD, filaments may need to be "pre-conditioned" by heating in the presence of reactive gases. Coatings formed during this "pre-conditioning" stage may not be of a quality (e.g., molecular weight, chemical purity, etc.) that is desirable for a given application. Further, the coating deposition rate may not be optimal until the filament has been "pre-conditioned".

As a result, filament "pre-conditioning" may normally be carried out prior to emplacement of articles in the coating chamber. With such a protocol, at least two chamber "runs" are required for each coating deposition cycle (i.e., one "pre-conditioning" run without the articles present, followed by one deposition run with the articles present). Such a "two-run" schedule may not be desirable during high-volume manufacturing, especially given that time may also be required for evacuating the chamber (pump-down) and raising the chamber pressure (backfill).

The use of gas flow as a soft shutter may allow the articles to be present in the chamber during filament "pre-conditioning". That is, the flowing gas may sweep away a large proportion of reactive species being formed, and keep them from adsorbing on the articles until a point during or after "pre-conditioning" when a polymer coating of the desired quality can be formed. (A "hard", physical shutter covering a large number of articles may be undesirable for cost, equipment complexity, or other reasons). In such an application, the gas may be inert. The gas may also be heated or cooled.

Flow of inert gas may also be utilized to isolate the reactive gas from direct contact with the energy source (such as the filament in HFCVD). This may allow for activation of the precursor gas while preventing undesirable side reaction due to too much energy input or catalytic effects (as from the filament material in HFCVD).

Figure 4:
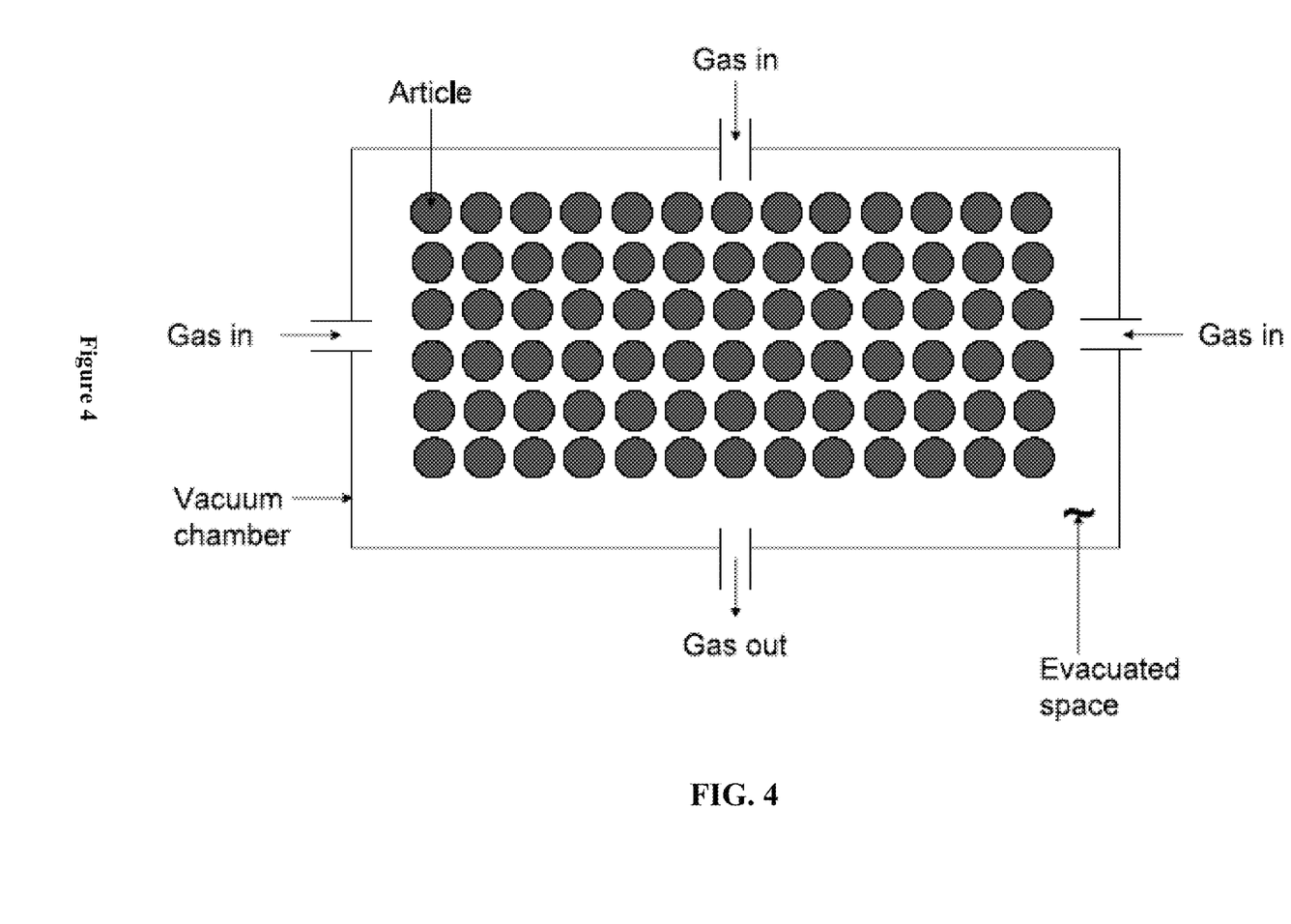
FIG. 4 shows a top-down view of a coating system outfitted with means of inputting gas from two directions (filament array and optional supports for articles are omitted for clarity).

Gases used for soft shuttering, temperature control of articles, or for formation of the polymer coating (or for any combination of these purposes) may be added to the chamber from one or more directions at a time. FIG. 4 shows a top-down view of a coating system outfitted with means of inputting gas from two directions (filament array and optional supports for articles are omitted for clarity). In this case, gas may be input in a direction parallel or perpendicular to the plane of the temperature-controlled plate, or both.

Figure 5:
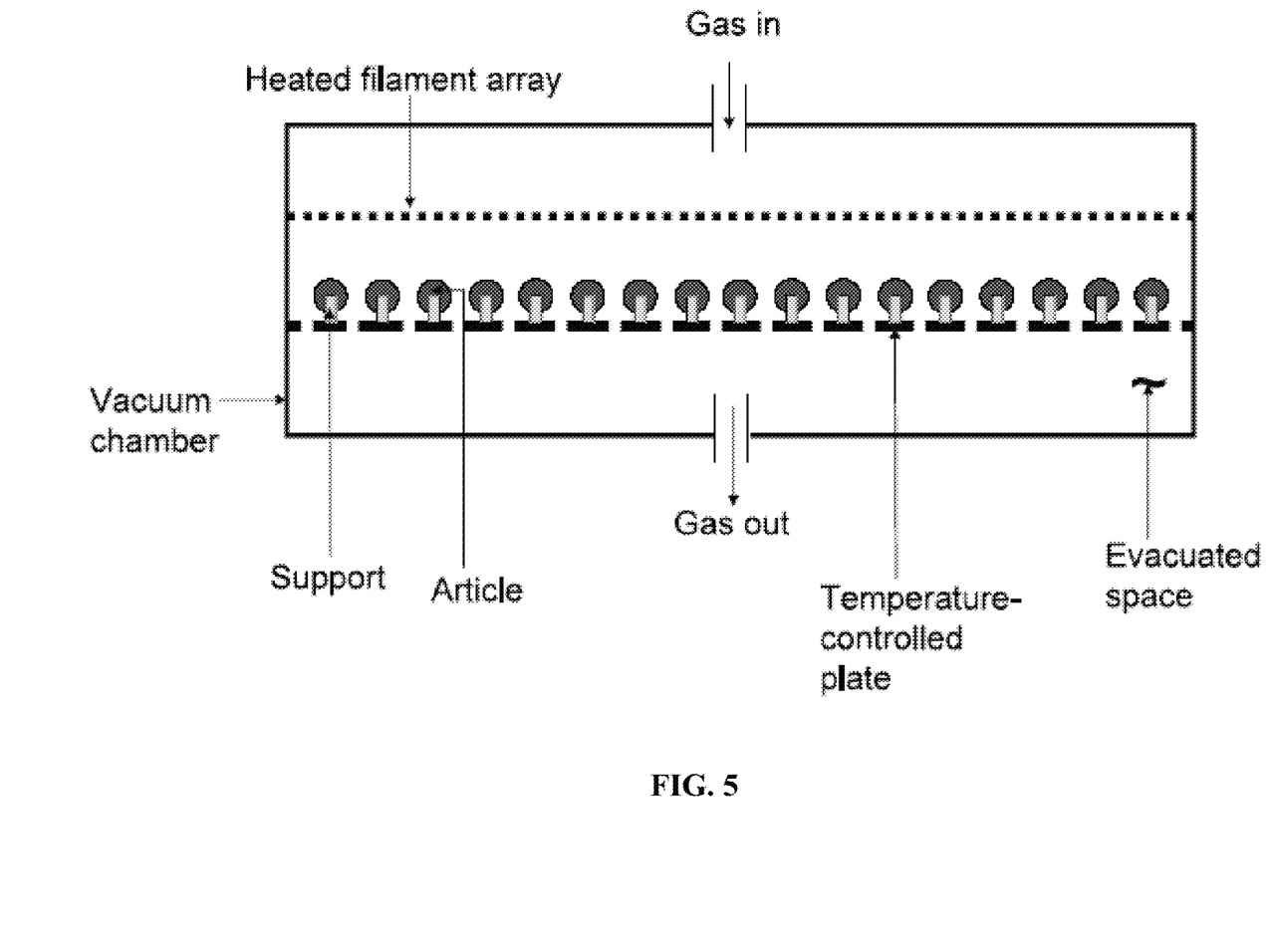
FIG. 5 is a side view of a coating system wherein the gases used for coating formation are fed into the coating chamber in a direction perpendicular to the plane of the temperature-controlled plate on which the articles are resting.

In particular, gases used for coating formation (such as HFPO for forming PTFE) may be fed into the chamber in a direction perpendicular to the plane of the temperature-controlled plate on which the articles are resting. This is shown in FIG. 5 (coating system side view). The temperature-controlled plate in FIG. 5 may have one or more openings which the gas can flow through toward an outlet port (after perhaps passing through the array of heated filaments and impinging on the articles being coated). By inputting gases from any of one or more directions, the uniformity of the coating being formed may be optimized. For example, the formation of reactive gas recirculation cells within the chamber volume can be eliminated or compensated for using this approach, affording improved coating uniformity.

I. Methods for Forming Metallic Coatings

Transfer of metal to an article may be useful for a variety of purposes, including improving the adhesion of a polymeric coating. Also disclosed is a method forming a metallic coating on an article including the steps of (1) evacuating a vacuum chamber, (2) heating one or more filaments so as to facilitate transfer of metal from the filaments to an article in the vicinity of the filaments, (3) introducing one or more gases into the vacuum chamber, (4) directing the one or more gases into the vicinity of an energy source, thereby activating the one or more gases, and (5) forming a polymer coating on the article.

A variety of energy sources may be used to activate one or more of the process gases, including, but not limited to, one or more heated filaments, ionic plasma, pulsed plasma, UV irradiation, or gamma irradiation.

The coating may be PTFE. The article may be metallic or have a metallic surface. In this method, the one or more filaments which are heated so as to facilitate transfer of metal may be different from any heated filaments which function as the energy source for gas activation. The filaments which are heated so as to facilitate transfer of metal may contain chromium or titanium. This method may be useful for coating, for example, metallic razor blades, metallic stencils, or metallic molds.

III. Filaments

Thermal damage to low-temperature articles during HFCVD can be exacerbated by in-service deformation of the heated filaments. Deformation can initially be caused by filament stretching and later by out-of-plane filament bowing when the filament is heated to coating deposition temperatures. The filament can bow toward the articles being coated, potentially damaging temperature-sensitive articles. Additionally, increased proximity of the hot filament to the article can discourage adsorption and growth of the polymer coating. As such, the coating deposition rates can drop to levels that are intolerable in a high-volume manufacturing environment. Means of detecting and preventing filament deformation are required so as to minimize any negative impact of such deformation on the coating deposition process.

In addition, the filament replacement schedule that is typical of hot-filament CVD processes (e.g., due to filament aging, deformation, and/or breakage) also require production delays. Shortening these delays would be useful.

A. Incorporation of Sensors

Filament bowing in conventional filament arrays is often preceded by undesirable elongation of the filament during a coating deposition run. Elongation often occurs because the filament is held taut or in some other desirable configuration during deposition. When heated to deposition temperatures, the filament then softens and bows.

The coating system operator may not be aware that filament elongation and bowing have begun until the article and/or filament have been compromised. To further mitigate this threat, a filament array containing a sensor to detect filament deformation as it occurs can be used. Activation of the sensor alerts the operator that the coating system requires attention. In some embodiments, the sensor may be an electrical contact switch. The electrical contact switch is activated when the filaments have elongated (stretched) to a predetermined extent within the array.

In other embodiments, the sensor may be an optical sensor. The optical sensor comprises a light beam that impinges on a photodetector. This light beam can be, for example, a laser. The optical sensor can be configured such that the light beam impinging on the photodetector is broken by the bowing of a filament (i.e. the filament deforms in a way such as to intersect the light beam's path). Alternatively, the bowing of a filament may allow a light beam to impinge on a photodetector. (That is, the filament may have been initially positioned so as to intersect the light beam's path, and bowing of the filament may move the filament out of this path such that the light beam is able to reach the photodetector.)

In addition, a hot filament coating system is disclosed herein, wherein a pyrometer both measures the temperature of one or more filaments and indicates mechanical deformation of one or more filaments.

B. Filament Orientation

In HFCVD, heat from the filament(s) can be used to activate one or more gases input into the chamber as well as to elevate the temperature of the articles being coated for coating optimization. Filament arrays are typically arranged such that the main filament axes are oriented parallel to the plane of the sample stage (as shown in FIGS. 1, 3, and 5).

However, excessive heat from the "array" of filaments configured in this way may damage the articles. For some applications, it may be desirable to optimize the separation between the filaments and the articles, while still facilitating activation of the reactive gases. To this end, an alternative filament array configuration is disclosed, wherein the filament array is configured in a vertical orientation relative to the plane of the temperature-controlled plate (sample stage), rather than in a conventional horizontal orientation.

Figure 6A:
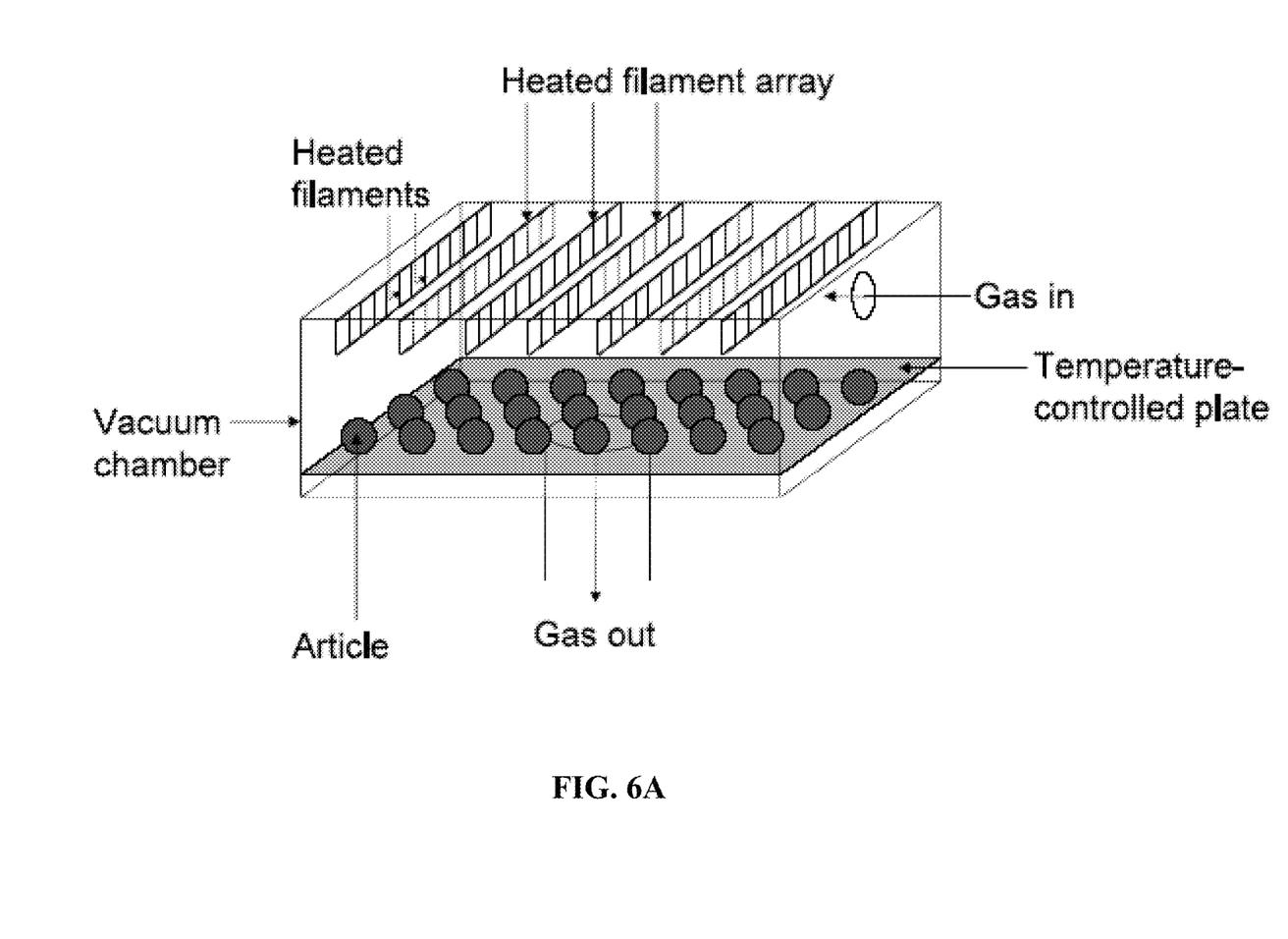
FIG. 6A shows a coating system in which the filament array is configured in a vertical orientation relative to the plane of the temperature-controlled plate (sample stage).
Figure 6B:
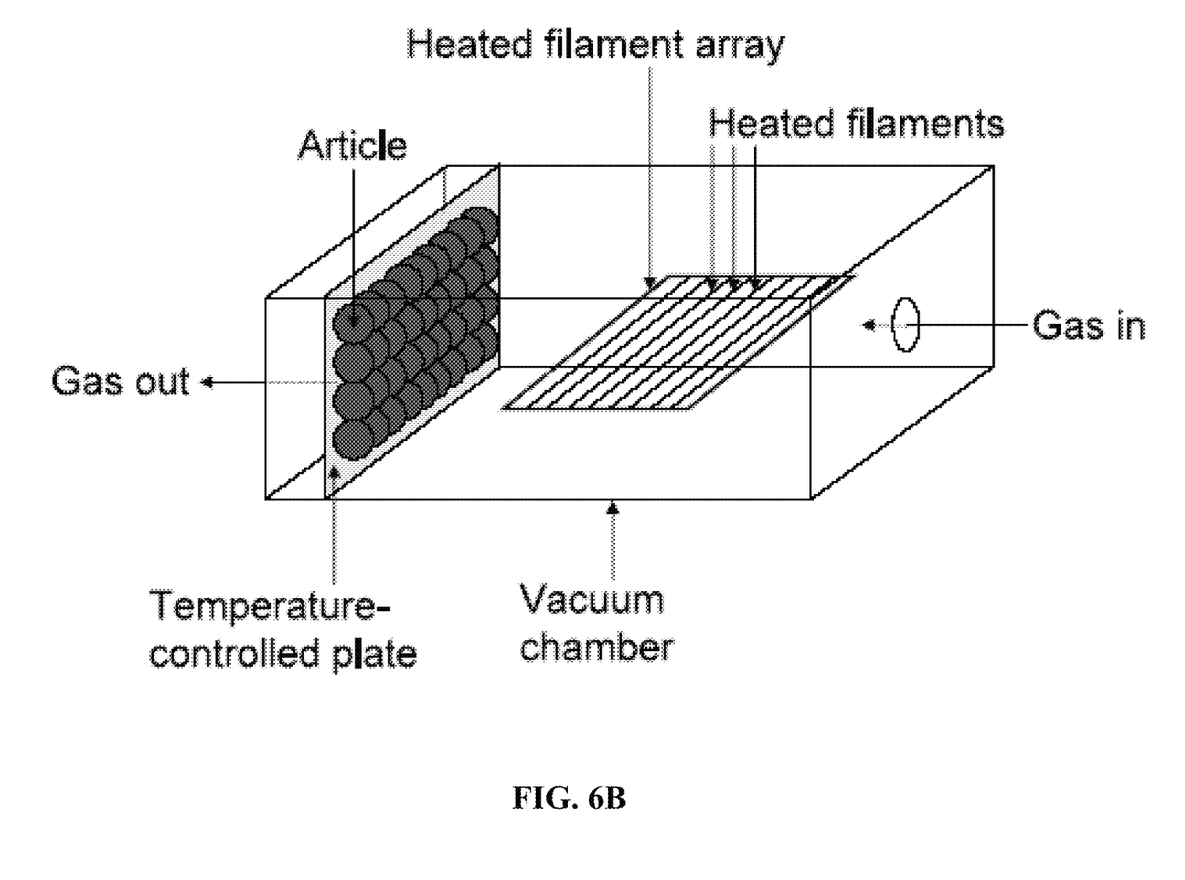
FIG. 6B shows a coating system in which the filament array is arranged in a substantially horizontal orientation and the articles to be coated are arranged in a substantially vertical orientation on the temperature-controlled plate.

In this vertical orientation, the plane running through the main filament axes is substantially perpendicular to the plane of the temperature-controlled plate (FIG. 6a). This arrangement may reduce the overall heat input to the articles (arranged in a horizontal orientation) from the filaments while maintaining the overall heat input to the reactive gas. Alternatively, the filament array may be arranged in a substantially horizontal orientation and the articles may be arranged in a substantially vertical orientation on the temperature-controlled plate (FIG. 6b). In this configuration, the plane running through the main filament axes may be perpendicular to the plane of the temperature-controlled plate. Other configurations in which the temperature-controlled plate and the plane running through the main filament axes are substantially perpendicular to one another may be obvious to one skilled in the art.

Such a perpendicular arrangement may also address another challenge associated with conventional filament arrays. Upon heating of a conventional filament array (typically to several hundred degrees Celsius), the filament may soften and begin to bow downward toward the articles. This may exacerbate any problems associated with excessive input of heat from filament to articles. Further, if the filament bowing occurs to a significant degree, the filament may actually come into contact with one or more articles and further damage or destroy the articles. Filament contact with articles or the stage may also damage, reduce the temperature of, or electrically short-circuit the filament, compromising the quality of all coated articles in the chamber. In the vertical filament arrangements shown in FIG. 6a and FIG. 6b, for example, the likelihood of article damage due to filament overheating or filament contact may be reduced, since the filaments may not be able to bow downward toward the articles.

C. Individually Spring Loaded Multi-Filament Arrays

Filament bowing in conventional filament arrays may occur because a single (or more than one) filament is looped over multiple pulleys within the array. The pulleys may be located at the periphery or outside of the deposition zone. In this way, a single (or more than one) filament can cross from one side to the other side of the vacuum chamber's coating deposition zone multiple times. The filament may be spring-loaded (i.e., subjected to a tensile load imposed by a coiled spring) at the ends. Such an arrangement may come with the expectation that this mechanical load will be distributed evenly across the full filament length, even if the filament crosses the deposition zone multiple times within the array.

This filament mounting approach has the benefit of simplicity and speed, both of which are critical considerations in the context of high-volume manufacturing. However, transfer of the spring load across the pulleys may not be complete. Therefore, sections of the filament length some distance from the pulleys may experience a different mechanical load than sections that are closer to the pulleys. Sections closer to the pulleys (e.g., closer to the deposition zone's periphery) may experience a higher load, and therefore may be more prone to stretching when heated during coating deposition. Sections farther from the pulleys (e.g., closer to the deposition zone's center) may experience a lower load, and therefore may be more prone to bowing when heated during coating deposition. The load on both section types may be lower the farther a given section is from the point(s) where the filament attaches to the supporting frame (and spring load). Overall, the filament may not be held taut or held in another desirable configuration as efficiently as possible, and therefore may be more prone to deformation.

Figure 7:
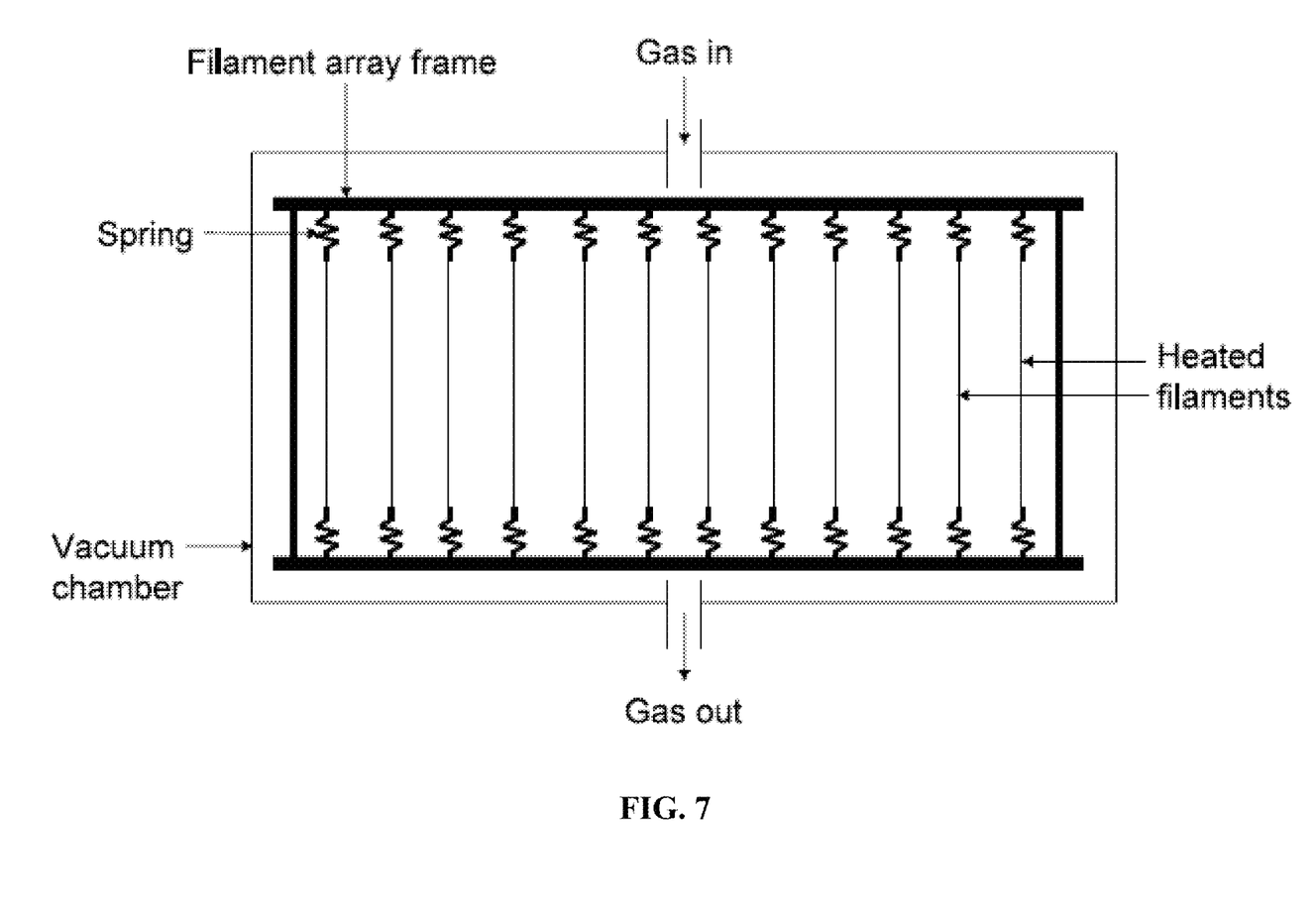
FIG. 7 shows a coating system in which the filament array contains multiple filaments that are individually spring-loaded.

To address this challenge, a filament array is disclosed containing multiple filaments that are individually spring-loaded (FIG. 7, top down view of chamber, articles omitted for clarity). In this approach, whenever the filament array crosses the deposition zone, the filament array does so using a discrete, stand-alone filament, rather than simply using a short section of a much longer filament. Each stand-alone filament may be attached to the filament array (frame) using one or more springs. When each filament is attached to the one or more springs, the spring(s) may be stretched so as to apply a tensile load to each filament during deposition of the coating. This improved array may largely eliminate the need for pulleys, and may ensure that the desired mechanical load is applied to each filament as it crosses the deposition zone. Consequently, filament bowing may be reduced.

D. Reel-to-Reel Filaments for Continuous Processing

Efficiency and profitability can be greatly improved if production down-time related to filament maintenance and replacement can be reduced. This may be particularly important when coatings are to be deposited in a continuous or semi-continuous fashion. Additionally, such efficiency may be required, for example) during the coating of medical products (where high-cleanliness manufacturing conditions may need to be preserved in a chamber that largely remains closed), high-volume conveyorized products (e.g., circuit boards), or "roll-to-roll" substrates (e.g., flexible electronics).

Figure 8:
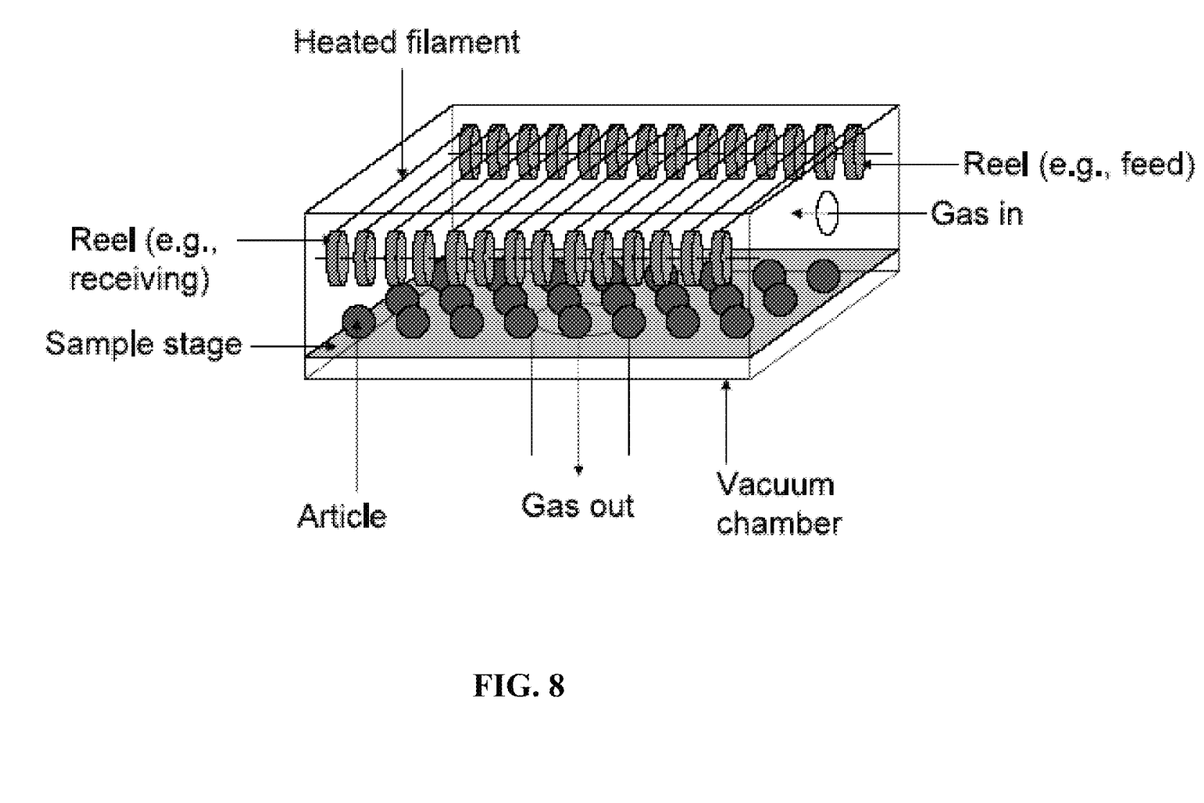
FIG. 8 shows a coating system in which the filament is a reel-to-reel filament.

A "reel-to-reel" filament array is disclosed that may be useful for coating such articles (FIG. 8). Specifically, a hot filament coating system is disclosed having filaments that are fed into a coating deposition zone from one or more "reels" (or spools) and that are removed from the coating zone by one or more reels. Prior to coating deposition, filament is wound onto one or more "feed reels". These feed reels are installed in the chamber, and may rotate (or otherwise be actuated) so as to feed filament into the deposition zone during manufacturing. The free end of each filament on each feed reel is then attached to a complementary "receiving reel" on the opposite side of the deposition zone in the chamber. (Each feed reel and its complementary receiving reel form a pair, and each pair forms at least a portion of a reel-to-reel filament array. Other supporting reels, pulleys, etc. may also be used.) At this point, a length of filament connects each pair of feed and receiving reels. A power supply is then connected to each length of filament at two connection points, such as at a point just before each filament length enters the deposition zone, and such as at a point just after each filament length leaves the deposition zone.

When coating deposition is desired, one or more lengths of filament within the deposition zone are energized, i.e., an electrical potential difference is applied to one or more filament length(s) at the two points where the filament length(s) is connected to the power supply. Electrical current flows through the energized filament(s) and the temperature of the filament(s) increases so as to support coating formation. Once one or more filaments have reached the end of their useful life (such as when the coating deposition rate drops to a certain value), the power supply will cease to energize the filaments. The physical connections between the one or more filaments and the power supply may then be disengaged. The receiving reel(s) may rotate (e.g., driven by a motor) or otherwise be actuated, removing the "spent" filament length(s) from the deposition zone and drawing one or more "fresh" filament length(s) from the feed reel(s) into the deposition zone. This "fresh" filament length(s) may not have been energized previously, even though it may have been physically attached to the filament length(s) that were energized previously. (That is, electrical current may have been constrained to flowing through the length of filament crossing the deposition zone, i.e., the length of filament located between the electrical connections to the power supply. Any lengths of filament still on the feed reel may not have been energized.)

The physical connections between the one or more filaments and the power supply may then be re-engaged. The "fresh" filament length(s) in the deposition zone can then be energized and used to support coating formation, and afterwards be withdrawn from the deposition zone by the receiving reel(s), as before, drawing additional "fresh" filament length(s) into the deposition zone in the process. This process may be repeated until the one or more feed reels have been depleted of "fresh" filament, at which point one or more new feed reels may be installed in the chamber to replace the depleted reel(s).

The sample stage (on which the articles being coated may rest) may comprise a conveyor belt for moving one or more articles into and out of the deposition zone for coating. (The sample stage may include a temperature-controlled plate, and the temperature-controlled plate may have supports on which the articles may rest.) One or more "fresh" filament length(s) may be fed into the deposition zone by the feed reel(s) and energized at the same time as other filament length(s), or at different times from other filament length(s). By feeding in and energizing "fresh" length(s) of filament(s) at different times from one another, the coating process can be run in a nearly continuous fashion, such that coating formation may not necessarily be interrupted while one or more filament lengths are being replaced. That is, the operator may elect to only energize a first subset of the filament lengths that are in the deposition zone at a given time. At another point in the coating process, the operator may then elect to energize a second subset of filament lengths in the deposition zone. The second subset of filament lengths may be energized prior to, while, or after the first subset of filament lengths are being removed from the deposition zone by the reel-to-reel system. In this way, coating formation may be carried out continuously over a certain time period even though the specific length(s) of energized filament(s) supporting coating formation may be changing during this time period. As needed, one or more filament length(s) may be first fed from the feed reel(s) into a first zone (e.g., an antechamber containing no articles) for filament "pre-conditioning", then fed into the deposition zone of the chamber (which may be attached to the first zone) to support coating formation, and then removed from the deposition zone by the receiving reel(s). The one or more filaments for this coating system may be energized by one or more power supplies and by using two or more electrical connectors. The "feed" and "receiving" reels may be attached to one or more springs so as to keep the filament length(s) in a desired configuration (e.g., taut) while the filament length(s) are traveling from the feed reel(s) to the receiving reel(s). As mentioned earlier, the coating system may be configured so that only the section of each filament that crosses the deposition zone at any given time on each pair of reels is energized. In this way, the energy expenditure for heating the reel-to-reel filament array may be minimized. Further, this may ensure that each "fresh" length of filament that is fed into the deposition zone will have roughly the same thermal history or electrical history or both. Any or all of the "feed" and "receiving" reels may be located outside of the chamber (i.e., in an area that may not have been evacuated), and filament may then be fed from the feed reel(s) to the receiving reel(s) through the chamber walls (and optionally through a first zone or antechamber) and through the deposition zone.

IV. Articles

The methods described herein can be used to coat a variety of substrates including, but not limited to, medical devices; electrical components; grooming products, such as razor blades; molds used to form different objects, such as tire molds; electronic components, optical components, industrial molding & stenciling components, elastomeric seals & gaskets, microelectronic mechanical (MEMS) devices, microfluidic devices, aviation components, and assembled electronic devices.

Examples of medical articles that can be coated using the methods described herein include, but are not limited to, surgical, medical or dental instruments, ophthalmic devices, implants, scaffolds, valves, pacemakers, pacemaker components, stents, catheters, rods, fracture fixation devices, pumps, tubing, wiring, electrodes, syringe assemblies (including syringe barrels, plungers or pistons, and plunger seals or piston seals), drug cartridges, needleless injectors, liquid dispensing devices, liquid metering devices, metered dose inhalers and components thereof, dry powder inhalers and components thereof, shunts, as well as diagnostic devices such as sensors. It should be understood that various aspects of the methods described above can be combined so as to form desirable coatings on various medical articles.

Articles are disclosed having an outer surface coated with a PTFE layer having a thickness of between about 1 nm and 25 microns, wherein at least a portion of the PTFE layer comprises polymeric chains formed of repeat units with at least 70% of the repeat units being $CF_2$ and with covalent bonds to the article. The article may be used in applications where the PTFE layer may experience significant mechanical loads, such as shear loads or tensile loads. Such applications include shaving (e.g., if the article is razor blade), solder paste transfer (e.g., if the article is a stencil), mold release (e.g., if the article is a mold), or sealing (e.g., if the article is an elastomer seal, such as a rubber stopper). Preferably, the PTFE layer has a thickness ranging from about 5 nm to about 10 microns. More preferably, the PTFE layer has a thickness ranging from about 25 nanometers to about 5 microns.

Using the methods described herein, PTFE layers composed of PTFE polymeric chains having a high percentage of $CF_2$ repeat units (high chemical purity) can be formed. In some cases, as least 70% of the repeat units are $CF_2$; at least 80% of the repeat units are $CF_2$; in some cases, at least 90% of the repeat units are $CF_2$; in some cases, at least 95% of the repeat units are $CF_2$; and in some cases, at least 99% of the repeat units are $CF_2$, or even about 100%. This is notable in that typical plasma-enhanced chemical vapor deposition (PECVD) techniques often do not produce PTFE coatings with such high chemical purity, with about 40-60% retention of $CF_2$ groups being more typical. Conventional PECVD PTFE coatings are often characterized by dangling bonds, double bonds, and crosslinks. The percentage of $CF_2$ units within the PTFE layer may be determined using fluorine-19 magic angle spinning nuclear magnetic resonance ($^{19}F$-NMR) or high-resolution X-ray photoelectron spectroscopy (XPS).

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

We claim:

1. A method of coating an article surface with an end-capped polymer comprising the steps of:
   (1) directing a precursor gas and a fluorocarbon gas into a chamber under vacuum containing the article to be coated, and
   (2) activating the precursor gas and the fluorocarbon gas with an energy source to form an end-capped polymer coating on the surface of the article, wherein the activated precursor gas forms polymer chains, and wherein the activated fluorocarbon gas end-caps the polymer chains.

2. The method of claim 1, wherein the energy source is one or more heated filaments and the precursor gas and the fluorocarbon gas are activated by pyrolysis.

3. The method of claim 1, wherein the precursor gas is hexafluoropropylene oxide (HFPO).

4. The method of claim 3, wherein the coating is polytetrafluoroethylene (PTFE).

5. The method of claim 4, wherein the PTFE coating comprises polymeric chains formed of repeat units with at least 70% of the repeat units being $CF_2$ and with end groups having diameters greater than that of the polymeric chains.

6. The method of claim 4, wherein the PTFE coating comprises polymeric chains formed of repeat units with at least 70% of the repeat units being $CF_2$ and with trifluoromethyl end groups.

7. The method of claim 4, wherein the end-capping decreases the crystalline content of the PTFE film by 5%.

8. The method of claim 1, wherein the end-capped polymer coating possesses a receding water contact angle of 5° less than that of the coating formed without introduction of the fluorocarbon gas.

9. The method of claim 1, wherein the fluorocarbon gas is hexafluoroethane.

10. The method of claim 1, wherein the degree of end-capping is greater than 40%.

11. The method of claim 1, wherein the precursor gas is hexafluoropropylene oxide (HFPO), wherein the fluorocarbon gas is hexafluoroethane, and wherein the coating is a PTFE end-capped polymer with trifluoromethyl end groups.

12. A method of coating an article surface with an end-capped polymer comprising the steps of:
   (1) directing a flow of a precursor gas into a chamber under vacuum containing the article to be coated;
   (2) activating the precursor gas with an energy source to form polymer chains coating the article;
   (3) ceasing the flow of the precursor gas;
   (4) commencing a flow of a fluorocarbon gas; and
   (5) activating the fluorocarbon gas with an energy source for end-capping the polymer chains to form an end-capped polymer coating on the surface of the article.

13. The method of claim 12, wherein the precursor gas is hexafluoropropylene oxide (HFPO).

14. The method of claim 13, wherein the coating is polytetrafluoroethylene (PTFE).

15. The method of claim 14, wherein the PTFE coating comprises polymeric chains formed of repeat units with at least 70% of the repeat units being $CF_2$ and with end groups having diameters greater than that of the polymeric chains.

16. The method of claim 14, wherein the PTFE coating comprises polymeric chains formed of repeat units with at least 70% of the repeat units being $CF_2$ and with trifluoromethyl end groups.

17. The method of claim 14, wherein the end-capping groups decrease the crystalline content of the PTFE film by 5%.

18. The method of claim 12, wherein the end-capped polymer coating possesses a receding water contact angle of 5° less than that of the coating formed without introduction of the fluorocarbon gas.

19. The method of claim 12, wherein the degree of end-capping is greater than 40%.

20. The method of claim 12, wherein the precursor gas is hexafluoropropylene oxide (HFPO), wherein the fluorocarbon gas is hexafluoroethane, and wherein the coating is a PTFE end-capped polymer with trifluoromethyl end groups.

* * * * *